United States Patent
McHugh et al.

(10) Patent No.: US 12,126,328 B2
(45) Date of Patent: Oct. 22, 2024

(54) ACOUSTIC FILTERS WITH SHARED ACOUSTIC TRACKS

(71) Applicant: Murata Manufacturing Co., Ltd., Nagaokakyo (JP)

(72) Inventors: Sean McHugh, Santa Barbara, CA (US); Kurt Raihn, Grass Valley, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 449 days.

(21) Appl. No.: 17/460,095

(22) Filed: Aug. 27, 2021

(65) Prior Publication Data
US 2022/0311420 A1     Sep. 29, 2022

Related U.S. Application Data

(60) Provisional application No. 63/165,359, filed on Mar. 24, 2021.

(51) Int. Cl.
*H03H 9/60*     (2006.01)
*H03H 3/02*     (2006.01)
*H03H 9/13*     (2006.01)
*H03H 9/205*    (2006.01)

(52) U.S. Cl.
CPC .............. *H03H 9/605* (2013.01); *H03H 3/02* (2013.01); *H03H 9/13* (2013.01); *H03H 9/205* (2013.01)

(58) Field of Classification Search
CPC ............ H03H 9/605; H03H 3/02; H03H 9/13; H03H 9/205; H03H 2003/023; H03H 9/174; H03H 9/568; H03H 9/02228
See application file for complete search history.

(56) References Cited

U.S. PATENT DOCUMENTS

| | | |
|---|---|---|
| 3,716,809 A | 2/1973 | Reeder et al. |
| 5,446,330 A | 8/1995 | Eda et al. |
| 5,552,655 A | 9/1996 | Stokes et al. |
| 5,726,610 A | 3/1998 | Allen et al. |
| 5,853,601 A | 12/1998 | Krishaswamy |
| 6,262,637 B1 | 7/2001 | Bradley et al. |
| 6,377,140 B1 | 4/2002 | Ehara et al. |
| 6,516,503 B1 | 2/2003 | Kada et al. |
| 6,540,827 B1 | 4/2003 | Levy et al. |
| 6,707,229 B1 | 3/2004 | Martin |

(Continued)

FOREIGN PATENT DOCUMENTS

| | | |
|---|---|---|
| DE | 19822028 A1 | 11/1998 |
| WO | 2016017104 | 2/2016 |
| WO | 2018003273 | 1/2018 |

OTHER PUBLICATIONS

Buchanan "Ceramic Materials for Electronics" 3rd Edition, first published in 2004 by Marcel Dekker, Inc. pp. 496 (Year 2004). Jan. 2004.

(Continued)

*Primary Examiner* — Andrea Lindgren Baltzell
*Assistant Examiner* — Kimberly E Glenn
(74) *Attorney, Agent, or Firm* — ArentFox Schiff LLP

(57) ABSTRACT

Acoustic filters devices and methods of making the same. A filter device includes two or more series resonators acoustically coupled along a shared acoustic track, and two or more shunt resonators electrically coupled to the two or more series resonators.

14 Claims, 5 Drawing Sheets

(56) References Cited

U.S. PATENT DOCUMENTS

| | | |
|---|---|---|
| 6,710,514 B2 | 3/2004 | Ikada et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,219,466 B2 | 12/2015 | Meltaus et al. |
| 9,276,557 B1 | 3/2016 | Nordquist et al. |
| 9,369,105 B1 | 6/2016 | Li et al. |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,666,220 B2 | 5/2020 | Kida et al. |
| 10,756,697 B2 | 8/2020 | Plesski et al. |
| 10,790,802 B2 | 9/2020 | Yantchev et al. |
| 10,797,675 B2 | 10/2020 | Plesski |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 2002/0079986 A1 | 6/2002 | Ruby et al. |
| 2002/0158714 A1 | 10/2002 | Kaitila et al. |
| 2002/0189062 A1 | 12/2002 | Lin et al. |
| 2003/0080831 A1 | 5/2003 | Naumenko et al. |
| 2003/0199105 A1 | 10/2003 | Kub et al. |
| 2004/0100164 A1 | 5/2004 | Murata |
| 2004/0261250 A1 | 12/2004 | Kadota et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0179642 A1 | 8/2006 | Kawamura |
| 2007/0024396 A1 | 2/2007 | Nam et al. |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayazi |
| 2010/0064492 A1 | 3/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto et al. |
| 2011/0278993 A1 | 11/2011 | Iwamoto |
| 2012/0286900 A1 | 11/2012 | Kadota et al. |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2016/0028367 A1 | 1/2016 | Shealy |
| 2016/0182009 A1 | 6/2016 | Bhattacharjee |
| 2017/0063332 A1 | 3/2017 | Gilbert et al. |
| 2017/0179225 A1 | 6/2017 | Kishimoto |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0278227 A1 | 9/2018 | Hurwitz |
| 2019/0068164 A1 | 2/2019 | Houlden et al. |
| 2019/0123721 A1 | 4/2019 | Takamine |
| 2019/0131953 A1 | 5/2019 | Gong |
| 2019/0273480 A1 | 9/2019 | Lin et al. |
| 2019/0348966 A1 | 11/2019 | Campanella-Pineda |
| 2019/0386636 A1 | 12/2019 | Plesski et al. |
| 2020/0021271 A1* | 1/2020 | Plesski ............... H03H 9/568 |
| 2020/0036357 A1 | 1/2020 | Mimura |
| 2020/0235719 A1 | 7/2020 | Yantchev et al. |
| 2020/0350891 A1 | 11/2020 | Turner |
| 2021/0013859 A1 | 1/2021 | Turner et al. |

OTHER PUBLICATIONS

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 2015.

Zou, Jie "High-Performance Aluminum Nitride Lamb Wave Resonators for RF Front-End Technology" University of California, Berkeley, Summer 2015, pp. 63 (Year 2015) Jan. 2015.

Santosh, G. , Surface acoustic wave devices on silicon using patterned and thin film ZnO, Ph.D. thesis, Feb. 2016, Indian Institute of technology Guwahati, Assam, India Feb. 2016.

Merriam Webster, dictionary meaning of the word "diaphragm", since 1828, Merriam Webster (Year: 1828) 1828.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

Safari et al. "Piezoelectric for Transducer Applications" published by Elsevier Science Ltd., pp. 4 (Year: 2000). 2020.

Moussa et al. Review on Triggered Liposomal Drug Delivery with a Focus on Ultrasound 2015, Bentham Science Publishers, pp. 16 (Year 2005) 2005.

(56) References Cited

OTHER PUBLICATIONS

Acoustic Properties of Solids ONDA Corporation 592 Weddell Drive, Sunnyvale, CA 94089, Apr. 11, 2003, pp. 5 (Year 2003). 2003.
Bahreyni, B. Fabrication and Design of Resonant Microdevices Andrew William, Inc. 2018, NY (Year 2008). 2008.
Material Properties of Tibtech Innovations, © 2018 TIBTECH Innovations (Year 2018). 2018.
USPTO/ISA, International Search Report and Written Opinion for PCT Application No. PCT/US2020/45654 dated Oct. 29, 2020.
T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.
M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
G. Manohar, "Investigation of Various Surface Acoustic Wave Design Configurations for Improved Sensitivity." Doctoral dissertation, University of South Florida, USA, Jan. 2012, 7 pages.
Ekeom, D. & Dubus, Bertrand & Volatier, A . . . (2006). Solidly mounted resonator (SMR) FEM-BEM simulation. 1474-1477. 10.1109/ULTSYM.2006.371.
Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.
Naumenko et al., "Optimal orientations of Lithium Niobate for resonator SAW filters", 2003 IEEE Ultrasonics Symposium—pp. 2110-2113. (Year: 2003).
Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.
Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.
A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.
USPTO/ISA, International Search Report and Written Opinion for PCT Application No. PCT/US2021/024824 dated Jul. 27, 2021, 9 total pages.

* cited by examiner

ACOUSTIC FILTERS WITH SHARED ACOUSTIC TRACKS

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This patent claim priority to provisional patent application No. 63/165,359, filed Mar. 24, 2021, entitled ACOUSTIC FILTERS WITH SHARED ACOUSTIC TRACKS, which is incorporated herein by reference.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation (5G) mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
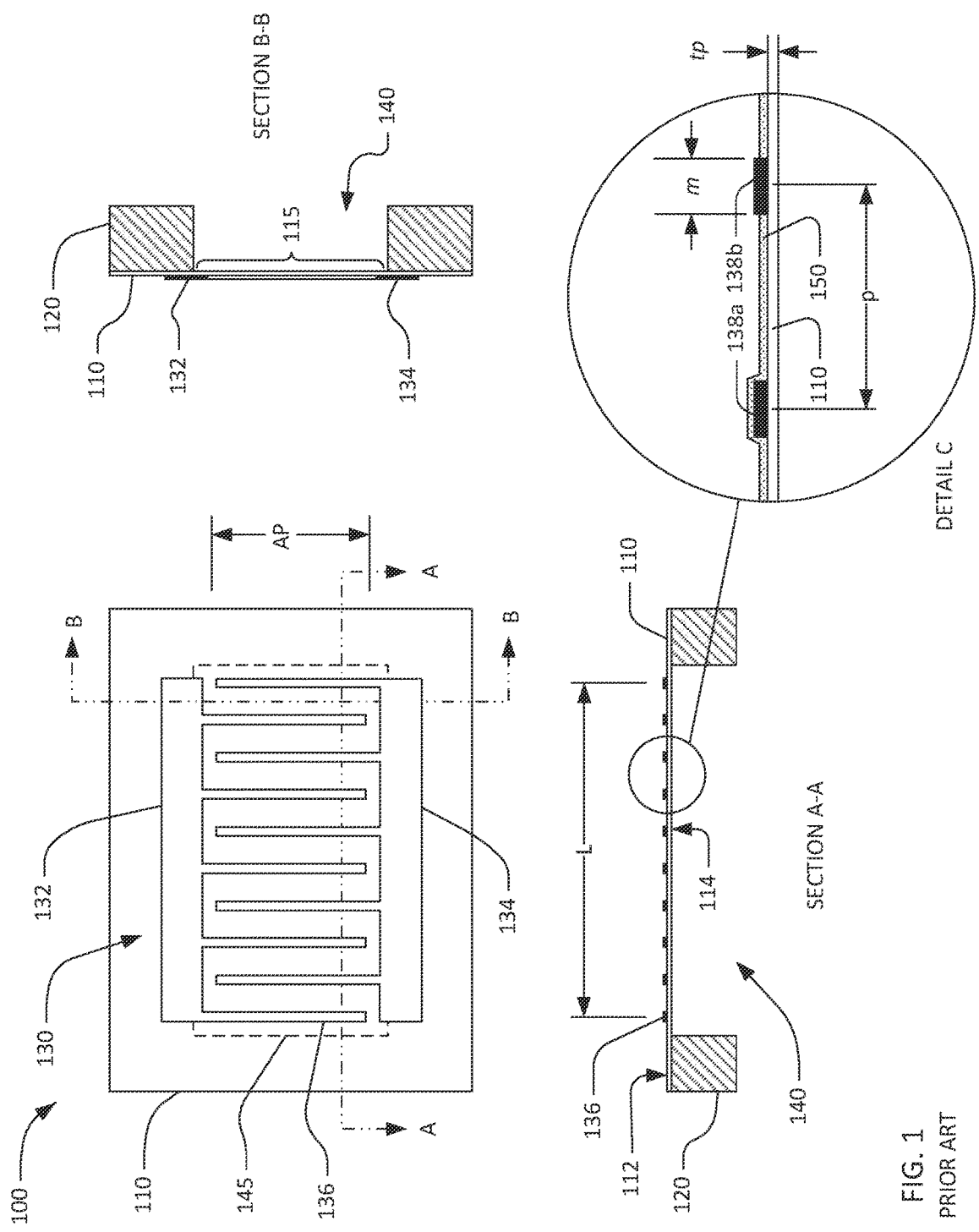
FIG. 1 includes a schematic plan view, two schematic cross-sectional views, and a detail view of a transversely-excited film bulk acoustic resonator (XBAR).

FIG. 1 shows a simplified schematic top view and orthogonal cross-sectional views of an XBAR 100. XBAR-type resonators such as the XBAR 100 may be used in a variety of RF filters including band-reject filters, band-pass filters, duplexers, and multiplexers.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut, which is to say the Z axis is normal to the front and back surfaces 112, 114. The piezoelectric plate may be ZY-cut, rotated Y-cut, rotated Z-cut or rotated YX-cut. XBARs may be fabricated on piezoelectric plates with other crystallographic orientations.

The back surface 114 of the piezoelectric plate 110 is attached to a surface of a substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be attached to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The term "busbar" means a conductor from which the fingers of an IDT extend. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. The primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may be more or fewer than four sides, which may be straight or curved.

For ease of presentation in FIG. 1, the geometric pitch and width of the IDT fingers are greatly exaggerated with respect to the length (dimension L) and aperture (dimension AP) of the XBAR. A typical XBAR has more than ten parallel fingers in the IDT 130. An XBAR may have hundreds, possibly thousands, of parallel fingers in the IDT 130. Similarly, the thicknesses of the IDT fingers and the piezoelectric plate in the cross-sectional views are greatly exaggerated.

Referring now to the detailed schematic cross-sectional view (Detail C), a front-side dielectric layer 150 (or coating) may optionally be formed on the front side of the piezoelectric plate 110. The "front side" of the XBAR is, by definition, the surface facing away from the substrate. The front-side dielectric layer 150 may be formed only between the IDT fingers (e.g. IDT finger 138b) or may be deposited as a blanket layer such that the dielectric layer is formed both between and over the IDT fingers (e.g. IDT finger 138a). The front-side dielectric layer 150 may be a non-piezoelectric dielectric material, such as silicon dioxide, alumina, or silicon nitride. A thickness of the front side dielectric layer 150 is typically less than about one-third of the thickness tp of the piezoelectric plate 110. The front-side dielectric layer 150 may be formed of multiple layers of two or more materials. In some applications, a back-side dielectric layer (not shown) may be formed on the back side of the piezoelectric plate 110.

The IDT fingers 138a, 138b may be one or more layers of aluminum, an aluminum alloy, copper, a copper alloy, beryllium, gold, tungsten, molybdenum, chromium, titanium or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of metals such as chromium or titanium may be formed under and/or over and/or as layers within the fingers to improve adhesion between the fingers and the piezoelectric plate 110 and/or to passivate or encapsulate the fingers and/or to improve power handling. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension m is the width or "mark" of the IDT fingers. The geometry of the IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT may be 2 to 20 times the width m of the fingers. The pitch p is typically 3.3 to 5 times the width m of the fingers. In addition, the pitch p of the IDT may be 2 to 20 times the thickness of the piezoelectric plate 210. The pitch p of the IDT is typically 5 to 12.5 times the thickness of the piezoelectric plate 210. The width m of the IDT fingers in an XBAR is not constrained to be near one-fourth of the acoustic wavelength at resonance. For example, the width of XBAR IDT fingers may be 500 nm or greater, such that the IDT can be readily fabricated using optical lithography. The thickness of the IDT fingers may be from 100 nm to about equal to the width m. The thickness of the busbars (132, 134) of the IDT may be the same as, or greater than, the thickness of the IDT fingers.

Figure 2:
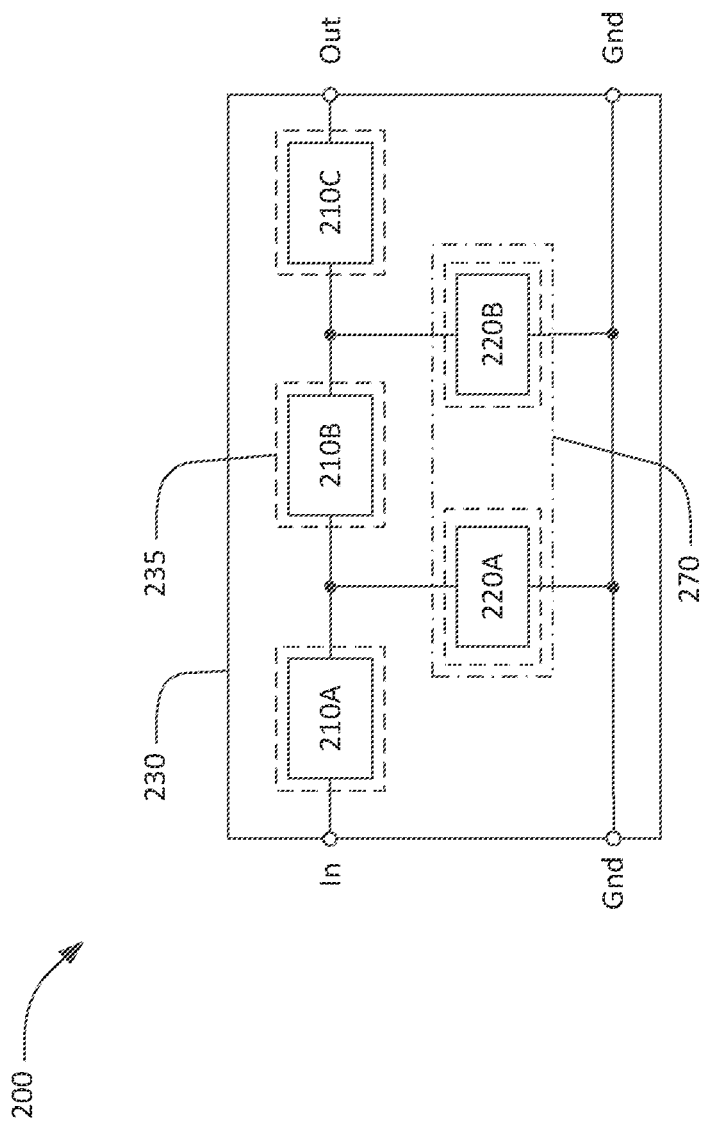
FIG. 2 is a schematic block diagram of a band-pass filter using acoustic resonators.

FIG. 2 is a schematic circuit diagram and layout for a high frequency band-pass filter 200 using XBARs. The filter 200 has a conventional ladder filter architecture including three series resonators 210A, 210B, 210C and two shunt resonators 220A, 220B. The three series resonators 210A, 210B, and 210C are connected in series between a first port and a second port (hence the term "series resonator"). In FIG. 2, the first and second ports are labeled "In" and "Out", respectively. However, the filter 200 is bidirectional and either port may serve as the input or output of the filter. The two shunt resonators 220A, 220B are connected from nodes between the series resonators to ground. A filter may contain additional reactive components, such as capacitors and/or inductors, not shown in FIG. 2. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and one of the input, the output, or a node between two series resonators.

In the exemplary filter 200, the three series resonators 210A, B, C and the two shunt resonators 220A, B of the filter 200 are formed on a single plate 230 of piezoelectric material bonded to a silicon substrate (not visible). In some filters, the series resonators and shunt resonators may be formed on different plates of piezoelectric material. Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 2, the cavities are illustrated schematically as the dashed rectangles (such as the rectangle 235). In this example, each IDT is disposed over a respective cavity. In other filters, the IDTs of two or more resonators may be disposed over a single cavity.

Each of the resonators 210A, 210B, 210C, 220A, 220B in the filter 200 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 200. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are positioned above the upper edge of the passband. In some filters, a front-side dielectric layer (also called a "frequency setting layer"), represented by the dot-dash rectangle 270, may be formed on the shunt resonators to set the resonance frequencies of the shunt resonators lower relative to the resonance frequencies of the series resonators. In other filters, the diaphragms of series resonators may be thinner than the diaphragms of shunt resonators. In some filters, the series resonators and the shunt resonators may be fabricated on separate chips having different piezoelectric plate thicknesses.

As seen in FIG. 2, acoustic resonators of a ladder filter are typically acoustically isolated and electrically coupled. For example, the acoustic resonators of the ladder filter are acoustically isolated when each resonator has a respective diaphragm and resonators do not share diaphragms. In this example, the interleaved fingers of the IDT of one resonator are on one diaphragm, and the interleaved fingers of the IDT of another resonator are on another diaphragm. The resonators in this example do not share an acoustic track because the resonators have separate diaphragms and are not acoustically coupled. Because each resonator requires a dedicated space for a diaphragm, the ladder filter has a relatively large footprint. If the resonators shared diaphragms, the footprint of the ladder filter could be comparatively small.

Figure 3A:
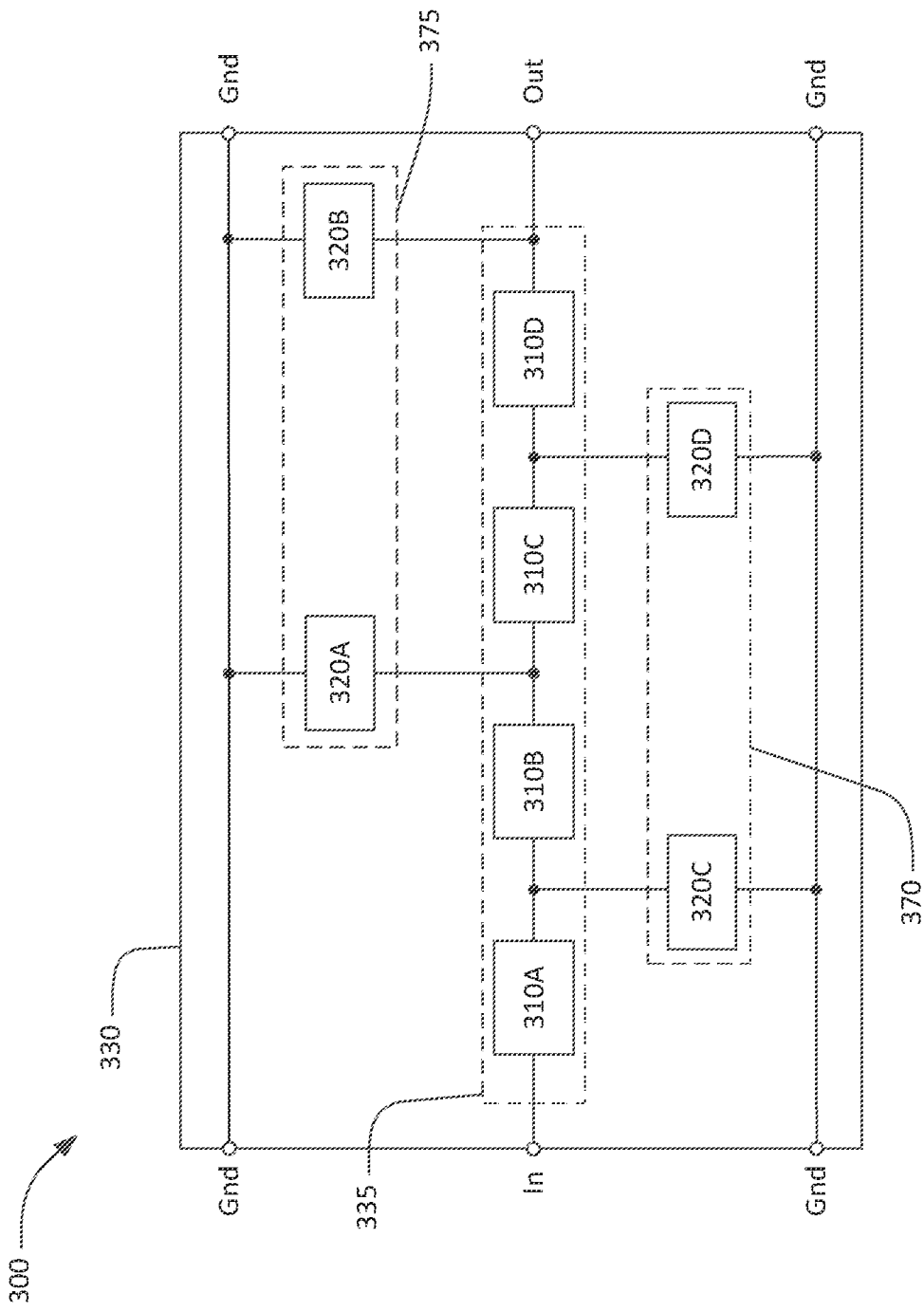
FIG. 3A is a schematic block diagram of a band-pass filter using XBARs with shared acoustic tracks.
Figure 3B:
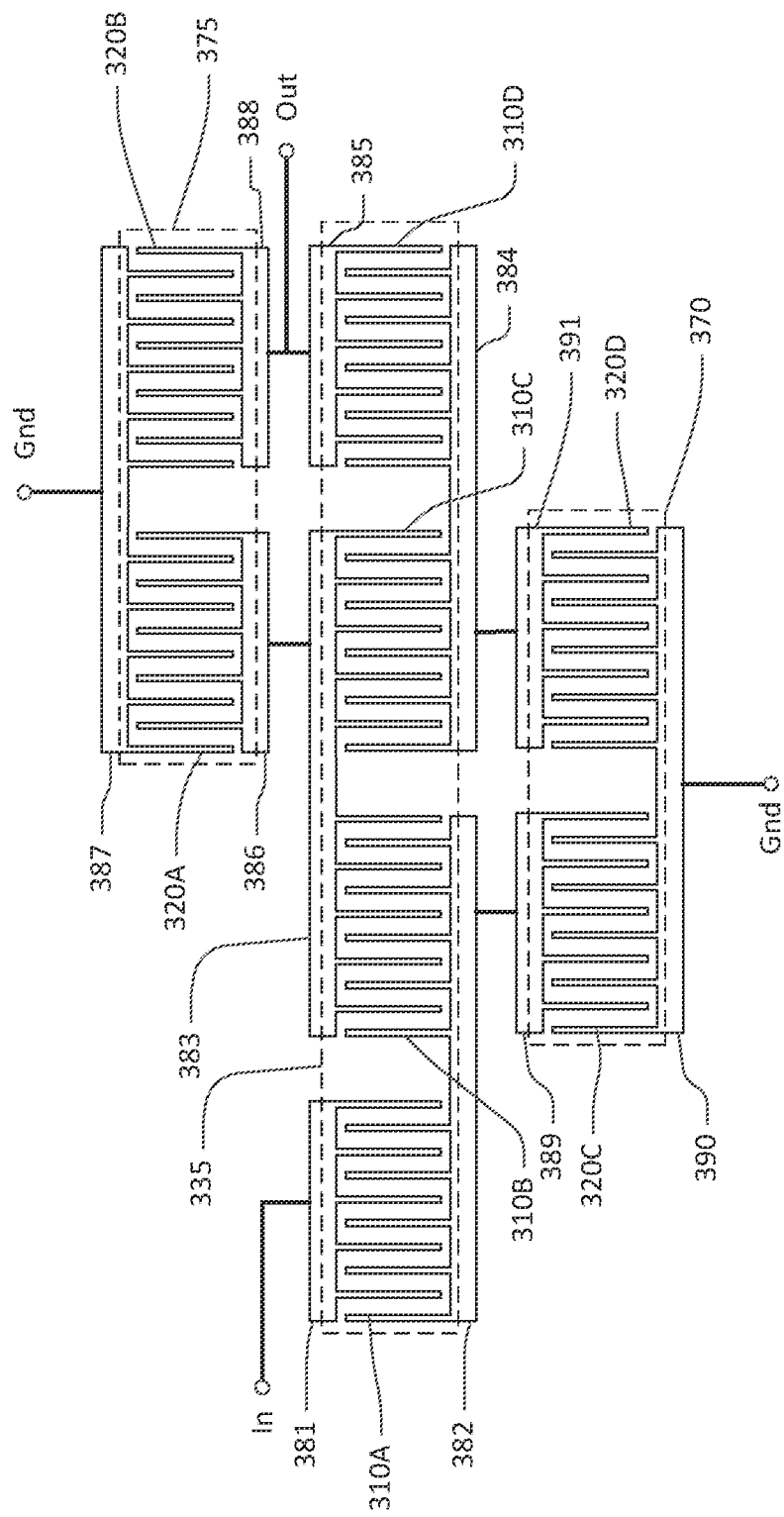
FIG. 3B is a schematic plan view of the band-pass filter of FIG. 3A.

FIG. 3A is a schematic block diagram of a band-pass filter 300 using XBARs where some of the resonators share an acoustic track. FIG. 3B is a schematic plan view of the band-pass filter 300 of FIG. 3A. This exemplary Acoustic Coupled Ladder (ACL) filter 300 has a ladder filter architecture including four series resonators 310A, 310B, 310C, 310D and four shunt resonators 320A, 320B, 320C, 320D. The four series resonators 310A, 310B, 310C, 310D are connected in series between a first port and a second port. In FIGS. 3A and 3B, the first and second ports are labeled "In" and "Out", respectively, but the filter 300 is bidirectional and either port may serve as the input or output of the filter. In this example as shown in FIG. 3B, series resonator 310A has an unshared top busbar 381 and a bottom busbar 382 (as positioned relative to each other in the view of FIG. 3B) shared with series resonator 310B, electrically coupling them. Series resonator 310B has a top busbar 383 shared with series resonator 310C, electrically coupling them. Series resonator 310C has a bottom busbar 384 shared with series resonator 310D, electrically coupling them. Series resonator 310D also has an unshared top busbar 385.

In this exemplary ACL filter 300, two of the shunt resonators 320A, 320B are located above the series resonators 310A, 310B, 310C, 310D (as positioned relative to each other in the views of FIGS. 3A and 3B), and two of the shunt resonators 320C and 320D are located below the series resonators 320A, 320B, 320C, 320D. Couplings to ground (Gnd) are located at both the top and bottom of the device 300 (as positioned relative to each other in the view of FIGS. 3A and 3B). Shunt resonator 320A is electrically connected between the upper ground and a node between series resonators 310B and 310C, and shunt resonator 320B is electrically connected between the upper ground and a node between series resonator 310D and port Out. As shown in FIG. 3B, shunt resonator 320A has an unshared bottom busbar 386 and a top busbar 387 shared with shunt resonator 320B, electrically coupling them. Shunt resonator 320B also has an unshared bottom busbar 388. Shunt resonator 320C is electrically connected between the lower ground and a node between series resonators 320A and 320B, and shunt resonator 320D is electrically connected between the lower ground and a node between series resonators 320C and 320D. Shunt resonator 320C has an unshared top resonator 389 and a bottom busbar 390 shared with shunt resonator 320D, electrically coupling them. Shunt resonator 320D also has an unshared top resonator 391.

A filter may contain additional reactive components, such as capacitors and/or inductors, not shown in FIGS. 3A and 3B. All the shunt resonators and series resonators are XBARs. The inclusion of four series and four shunt resonators is exemplary. A filter may have more or fewer than eight total resonators, more or fewer than four series resonators, and more or fewer than four shunt resonators. Typically, all of the series resonators are electrically connected in series between an input and an output of the filter, and shunt resonators are electrically connected between a ground and a node between series resonators.

In the filter 300, the four series resonators 310A, 310B, 310C, 310D and the four shunt resonators 320A, 320B, 320C, 320D are formed on a single plate 330 of piezoelectric material bonded to a silicon substrate (not visible). Each resonator includes a respective IDT (not shown), with at least the interleaved fingers of the IDT disposed over a cavity in the substrate. In FIG. 3A, the cavities are illustrated schematically as the dashed rectangles. In this example, interleaved fingers of the IDTs of series resonators 310A, 310B, 310C, 310D are on one diaphragm over a single cavity 335. Because series resonators 310A, 310B, 310C, 310D are on one diapragm, series resonators 310A, 310B, 310C, 310D are acoustically coupled and share an acoustic track. Further in this example, interleaved fingers of the IDTs of shunt resonators 320A, 320B are on one diaphragm over a single cavity 375. Because shunt resonators 320A, 320B are on one diaphragm, shunt resonators 320A, 320B are acoustically coupled and share an acoustic track. Also, interleaved fingers of the IDTs of shunt resonators 320C, 320D are on one diaphragm over a single cavity 370. Because shunt resonators 320C, 320D are on one diaphragm, shunt resonators 320C, 320D are acoustically coupled and share an acoustic track.

Because of the shared diaphragms, device 300 can have a much smaller footprint due to saved space. For example, in a typical ladder filter layout, the dimensions of the device are about 1680 microns by about 1480 microns. In a similar ladder filter layout that instead has shared diaphragms, the dimensions of the device are about 1650 microns by about 658 microns. The smaller footprint can result in reduced manufacturing costs and higher yields.

In some examples, there will be interactions between resonators with a shared acoustic track. If the IDTs are close, the interactions can be strong enough that the electrical response is affected. Positioning the IDTs sufficiently far apart (e.g., about 5 time pitch or about 20 microns) can prevent interaction.

The ACL filter 300 of FIGS. 3A and 3B is merely exemplary, and other layouts with shared acoustic tracks are possible. For example, the series resonators may be split amongst two, three, four, or more diaphragms. In one example, two series resonators may be on one diaphragm and two other series resonators may be on another diaphragm. In another example, three series resonators may be on one diaphragm and another single series resonator may be on another diaphragm.

In another example, the shunt resonators may be spilt amongst two, three, four, or more diaphragms. In one example, all of the shunt resonators are on one diaphragm. In another example, three shunt resonators are on one diaphragm, and one shunt resonator is individually on another diaphragm.

ACL filters can have both multiple resonators on one diaphragm and single resonators on other diaphragms. For example, all of the series resonators may be on one diaphragm, while each shunt resonator is on individually on a diaphragm. In another, all of the shunt resonators may be on one diaphragm, while each series resonator is on individually on a diaphragm. Some series resonators may share a diaphragm and some series resonators may be individually on a diaphragm, while some shunt resonators may share a diaphragm and some shunt resonators may be individually on a diaphragm. ACL filters can have other numbers of series resonators and shunt resonators. In other examples, the device has other numbers of couplings to ground, such as one, three, four, or more.

Description of Methods

Figure 4:
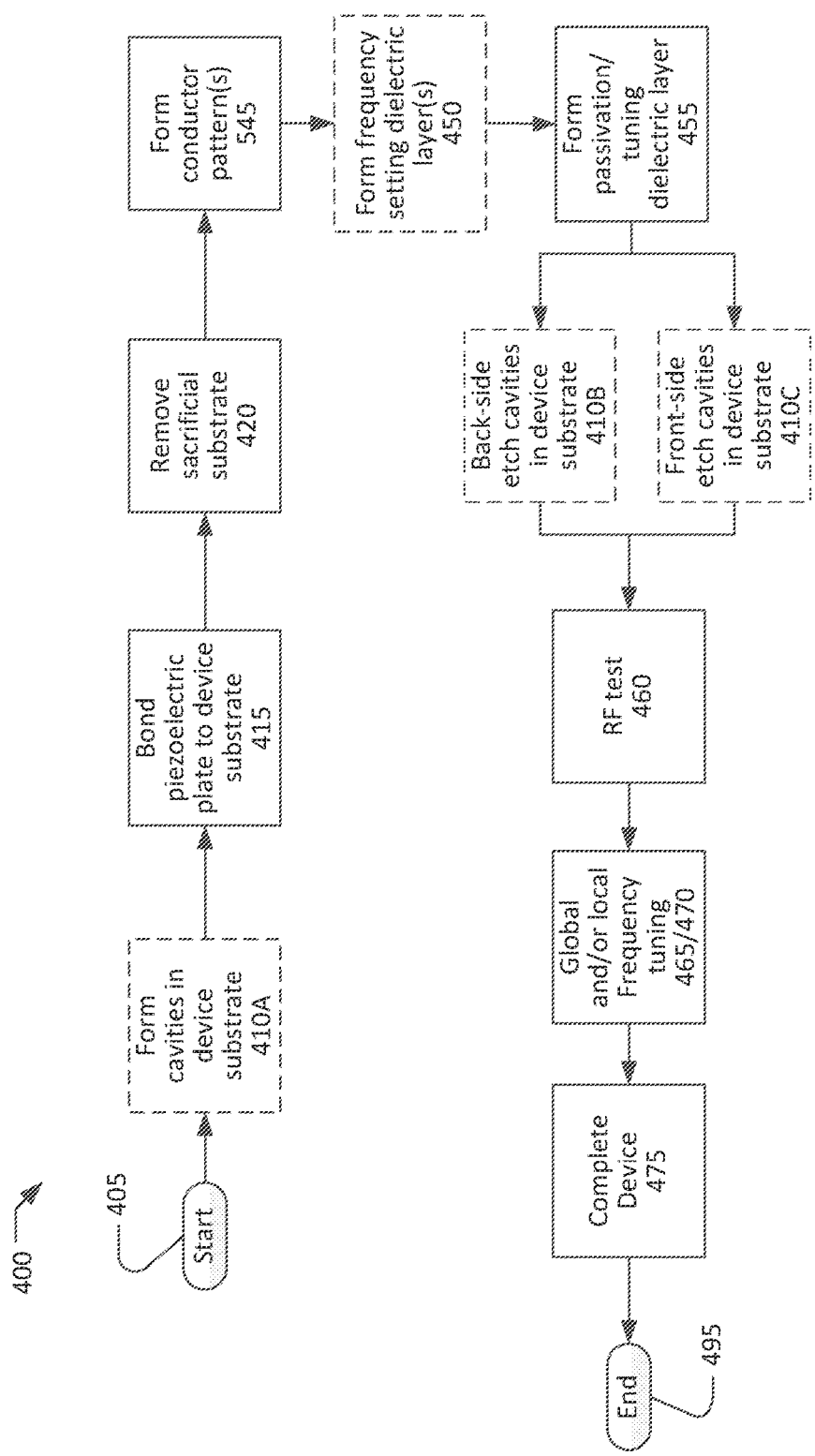
FIG. 4 is a flow chart of a method for fabricating a filter with XBAR with shared acoustic tracks.

FIG. 4 is a simplified flow chart summarizing a process 400 for fabricating a filter device incorporating XBARs. Specifically, the process 400 is for fabricating a filter device including multiple XBARs, some of which may include a frequency setting dielectric or coating layer. The process 400 starts at 405 with a device substrate and a thin plate of piezoelectric material disposed on a sacrificial substrate. The process 400 ends at 495 with a completed filter device. The flow chart of FIG. 4 includes only major process steps. Various conventional process steps (e.g. surface preparation, cleaning, inspection, baking, annealing, monitoring, testing, etc.) may be performed before, between, after, and during the steps shown in FIG. 4.

While FIG. 4 generally describes a process for fabricating a single filter device, multiple filter devices may be fabricated simultaneously on a common wafer (consisting of a piezoelectric plate bonded to a substrate). In this case, each step of the process 400 may be performed concurrently on all of the filter devices on the wafer.

The flow chart of FIG. 4 captures three variations of the process 400 for making an XBAR which differ in when and how cavities are formed in the device substrate. The cavities may be formed at steps 410A, 410B, or 410C. Only one of these steps is performed in each of the three variations of the process 400.

The piezoelectric plate may typically be ZY-cut or rotated YX-cut lithium niobate. The piezoelectric plate may be some other material and/or some other cut. The device substrate may preferably be silicon. The device substrate may be some other material that allows formation of deep cavities by etching or other processing.

In one variation of the process 400, one or more cavities are formed in the device substrate at 410A, before the piezoelectric plate is bonded to the substrate at 415. A separate cavity may be formed for each resonator in a filter device. Also, the cavities can be shaped and formed such that two or more resonators can be on one diaphragm over one cavity. These resonators sharing a diaphragm are acoustically coupled on an acoustic track. The one or more cavities may be formed using conventional photolithographic and etching techniques. Typically, the cavities formed at 410A will not penetrate through the device substrate.

At 415, the piezoelectric plate is bonded to the device substrate. The piezoelectric plate and the device substrate may be bonded by a wafer bonding process. Typically, the mating surfaces of the device substrate and the piezoelectric plate are highly polished. One or more layers of intermediate materials, such as an oxide or metal, may be formed or deposited on the mating surface of one or both of the piezoelectric plate and the device substrate. One or both mating surfaces may be activated using, for example, a plasma process. The mating surfaces may then be pressed together with considerable force to establish molecular bonds between the piezoelectric plate and the device substrate or intermediate material layers.

At 420, the sacrificial substrate may be removed. For example, the piezoelectric plate and the sacrificial substrate may be a wafer of piezoelectric material that has been ion implanted to create defects in the crystal structure along a plane that defines a boundary between what will become the piezoelectric plate and the sacrificial substrate. At 420, the wafer may be split along the defect plane, for example by thermal shock, detaching the sacrificial substrate and leaving the piezoelectric plate bonded to the device substrate. The exposed surface of the piezoelectric plate may be polished or processed in some manner after the sacrificial substrate is detached.

A first conductor pattern, including IDTs and reflector elements of each XBAR, is formed at 445 by depositing and patterning one or more conductor layers on the front side of the piezoelectric plate. All or portions of the first conductor pattern may be over the coating layer formed at 425. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A second conductor pattern of gold, aluminum, copper or other higher conductivity metal may be formed over portions of the first conductor pattern (for example the IDT bus bars and interconnections between the IDTs).

Each conductor pattern may be formed at 445 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, or other etching techniques.

Alternatively, each conductor pattern may be formed at 445 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 450, one or more frequency setting dielectric layer(s) may be formed by depositing one or more layers of dielectric material on the front side of the piezoelectric plate. For example, a dielectric layer may be formed over the shunt resonators to lower the frequencies of the shunt resonators relative to the frequencies of the series resonators. The one or more dielectric layers may be deposited using a conventional deposition technique such as physical vapor deposition, atomic layer deposition, chemical vapor deposition, or some other method. One or more lithography processes (using photomasks) may be used to limit the deposition of the dielectric layers to selected areas of the piezoelectric plate. For example, a mask may be used to limit a dielectric layer to cover only the shunt resonators.

At 455, a passivation/tuning dielectric layer is deposited over the piezoelectric plate and conductor patterns. The passivation/tuning dielectric layer may cover the entire surface of the filter except for pads for electrical connections to circuitry external to the filter. In some instantiations of the process 400, the passivation/tuning dielectric layer may be formed after the cavities in the device substrate are etched at either 410B or 410C.

In a second variation of the process 400, one or more cavities are formed in the back side of the device substrate at 410B. A separate cavity may be formed for each resonator in a filter device. Also, the cavities can be shaped and formed such that two or more resonators can be on one diaphragm over one cavity. These resonators sharing a diaphragm are acoustically coupled on an acoustic track. The one or more cavities may be formed using an anisotropic or orientation-dependent dry or wet etch to open holes through the back side of the device substrate to the piezoelectric plate. In this case, the resulting resonator devices will have a cross-section as shown in FIG. 1.

In a third variation of the process 400, one or more cavities in the form of recesses in the device substrate may be formed at 410C by etching the substrate using an etchant introduced through openings in the piezoelectric plate. A separate cavity may be formed for each resonator in a filter device. Also, the cavities can be shaped and formed such that two or more resonators can be on one diaphragm over one cavity. These resonators sharing a diaphragm are acoustically coupled on an acoustic track. The one or more cavities formed at 410C will not penetrate through the device substrate. For all cavity forming steps 410A, 410B, and 410C, the dimensions of the cavity will be formed with respect to the dimensions of the IDTs of the conductor pattern, as described above with respect to FIGS. 2, 3A, and 3B.

Ideally, after the cavities are formed at 410B or 410C, most or all of the filter devices on a wafer will meet a set of performance requirements. However, normal process tolerances will result in variations in parameters such as the thicknesses of dielectric layer formed at 450 and 455, variations in the thickness and line widths of conductors and IDT fingers formed at 445, and variations in the thickness of the piezoelectric plate. These variations contribute to deviations of the filter device performance from the set of performance requirements.

To improve the yield of filter devices meeting the performance requirements, frequency tuning may be performed by selectively adjusting the thickness of the passivation/tuning layer deposited over the resonators at 455. The frequency of a filter device passband can be lowered by adding material to the passivation/tuning layer, and the frequency of the filter device passband can be increased by removing material to the passivation/tuning layer. Typically, the process 400 is biased to produce filter devices with passbands that are initially lower than a required frequency range but can be tuned to the desired frequency range by removing material from the surface of the passivation/tuning layer.

At 460, a probe card or other means may be used to make electrical connections with the filter to allow radio frequency (RF) tests and measurements of filter characteristics such as input-output transfer function. Typically, RF measurements are made on all, or a large portion, of the filter devices fabricated simultaneously on a common piezoelectric plate and substrate.

At 465, global frequency tuning may be performed by removing material from the surface of the passivation/tuning layer using a selective material removal tool such as, for example, a scanning ion mill as previously described. "Global" tuning is performed with a spatial resolution equal to or larger than an individual filter device. The objective of global tuning is to move the passband of each filter device towards a desired frequency range. The test results from 460 may be processed to generate a global contour map indicating the amount of material to be removed as a function of two-dimensional position on the wafer. The material is then removed in accordance with the contour map using the selective material removal tool.

At 470, local frequency tuning may be performed in addition to, or instead of, the global frequency tuning performed at 465. "Local" frequency tuning is performed with a spatial resolution smaller than an individual filter device. The test results from 460 may be processed to generate a map indicating the amount of material to be removed at each filter device. Local frequency tuning may require the use of a mask to restrict the size of the areas from which material is removed. For example, a first mask may be used to restrict tuning to only shunt resonators, and a second mask may be subsequently used to restrict tuning to only series resonators (or vice versa). This would allow independent tuning of the lower band edge (by tuning shunt resonators) and upper band edge (by tuning series resonators) of the filter devices.

After frequency tuning at 465 and/or 470, the filter device is completed at 475. Actions that may occur at 475 include forming bonding pads or solder bumps or other means for making connection between the device and external circuitry (if such pads were not formed at 445); excising individual filter devices from a wafer containing multiple filter devices; other packaging steps; and additional testing. After each filter device is completed, the process ends at 495.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A filter device comprising:
    two or more series resonators acoustically coupled along a shared acoustic track;
    three or more shunt resonators electrically coupled to the two or more series resonators;
    a substrate;
    a piezoelectric layer attached to the substrate either directly or via one or more intermediate layers and including a plurality of diaphragms spanning a plurality of cavities; and
    a conductor pattern at the piezoelectric layer and comprising a plurality of interdigital transducers (IDTs) of a plurality of resonators that includes the two or more series resonators that each include an IDT with interleaved fingers on a first diaphragm of the plurality of diaphragms,
    wherein the plurality of resonators further comprises the three or more shunt resonators,
    wherein two resonators of the three or more shunt resonators each include an IDT with interleaved fingers on a second diaphragm of the plurality of diaphragms, and a third resonator of the three or more shunt resonators includes an IDT with interleaved fingers on a third diaphragm of the plurality of diaphragms.

2. The filter device of claim 1, wherein the two or more series resonators comprises three or more series resonators, and wherein interleaved fingers of an IDT of one resonator of the three or more series resonators are on an additional diaphragm of the plurality of diaphragms.

3. The filter device of claim 1, wherein the two or more series resonators comprises four series resonators, interleaved fingers of IDTs of the four series resonators being disposed on the first diaphragm of the plurality of diaphragms, and wherein the three or more shunt resonators comprises four shunt resonators, with interleaved fingers of the respective IDT of a fourth shunt resonators being disposed on the third diaphragm of the plurality of diaphragms.

4. The filter device of claim 1, wherein a primary shear acoustic mode is excited by respective IDTs of the plurality of IDTs in the piezoelectric layer.

5. The filter device of claim 4, wherein the shear primary acoustic mode is excited in response to a radio frequency signal applied to the respective IDTs.

6. The filter device of claim 1, wherein the piezoelectric layer is lithium niobate.

7. The filter device of claim 1, wherein the three or more shunt resonators are coupled along a second shared acoustic track.

8. A method of fabricating a filter device comprising:
    forming two or more series resonators acoustically coupled along a shared acoustic track;
    forming three or more shunt resonators electrically coupled to the two or more series resonators;

forming a plurality of cavities such that portions of a piezoelectric layer form a plurality of diaphragms over each of the respective plurality of cavities; and forming a conductor pattern at the piezoelectric layer that includes a plurality of interdigital transducers (IDTs) of a respective plurality of resonators including the two or more series resonators and the three or more shunt resonators, wherein the two or more series resonators are formed to include an IDT with interleaved fingers on a first diaphragm of the plurality of diaphragms, wherein two resonators of the three or more shunt resonators are formed to each include an IDT with interleaved fingers on a second diaphragm of the plurality of diaphragms, and wherein a third resonator of the three or more shunt resonators is formed to include an IDT with interleaved fingers on a third diaphragm of the plurality of diaphragms.

9. The method of claim 8, wherein the two or more series resonators comprises three or more series resonators, and wherein interleaved fingers of an IDT of one resonator of the three or more series resonators are on an additional diaphragm of the plurality of diaphragms.

10. The method of claim 8, further comprising forming the two or more series resonators to include four series resonators, interleaved fingers of IDTs of the four series resonators being disposed on the first diaphragm of the plurality of diaphragms, and wherein the three or more shunt resonators comprises four shunt resonators, with interleaved fingers of the respective IDT of a fourth shunt resonators being disposed on the third diaphragm of the plurality of diaphragms.

11. The method of claim 8, wherein a primary shear acoustic mode is excited by respective IDTs of the plurality of IDTs in the piezoelectric layer.

12. The method of claim 11, wherein the shear primary acoustic mode is excited in response to a radio frequency signal applied to the respective IDTs.

13. The method of claim 8, wherein the piezoelectric layer is lithium niobate.

14. The method of claim 8, wherein the three or more shunt resonators are coupled along a second shared acoustic track.

\* \* \* \* \*